US012423227B2

(12) United States Patent
Xu et al.

(10) Patent No.: US 12,423,227 B2
(45) Date of Patent: Sep. 23, 2025

(54) GENERATING VIRTUAL BLOCKS USING PARTIAL GOOD BLOCKS

(71) Applicant: Micron Technology, Inc., Boise, ID (US)

(72) Inventors: Zhongguang Xu, San Jose, CA (US); Guang Hu, Mountain View, CA (US); Xiangang Luo, Fremont, CA (US); Jung Sheng Hoei, Newark, CA (US); Ting Luo, Santa Clara, CA (US); Zhenming Zhou, San Jose, CA (US); Jianmin Huang, San Carlos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/411,940

(22) Filed: Jan. 12, 2024

(65) Prior Publication Data

US 2024/0256444 A1   Aug. 1, 2024

Related U.S. Application Data

(60) Provisional application No. 63/441,342, filed on Jan. 26, 2023.

(51) Int. Cl.
*G06F 12/06* (2006.01)

(52) U.S. Cl.
CPC ................. *G06F 12/0607* (2013.01)

(58) Field of Classification Search
CPC ...... G05B 13/00–048; G05B 15/00–02; G05B 17/00–02; G06F 1/00–3296;

(Continued)

(56) References Cited

U.S. PATENT DOCUMENTS 9,396,103 B2 * 7/2016 Sinclair ............... G06F 12/0246
10,540,274 B2 * 1/2020 Szubbocsev .......... G06F 3/0679

(Continued)

FOREIGN PATENT DOCUMENTS

| CN | 114398010 A | | 4/2022 | |
|---|---|---|---|---|
| TW | 201122812 A | * | 7/2011 | ......... G06F 12/0246 |
| WO | 2024158577 | | 8/2024 | |

OTHER PUBLICATIONS

Definition of "transgress"; Merriam-Webster Online Dictionary; retrieved from https://www.merriam-webster.com/dictionary/transgressed on Dec. 10, 2024 (Year: 2024).*

(Continued)

*Primary Examiner* — Daniel C. Chappell
(74) *Attorney, Agent, or Firm* — Schwegman Lundberg & Woessner, P.A.

(57) ABSTRACT

Aspects of the present disclosure configure a system component, such as a memory sub-system controller, to generate virtual or superblocks using multiple partial good blocks. The controller identifies a first partial good block (PGB) in a set of memory components, the first PGB having first subset of word line groups (WGRs) that are categorized as being non-defective. The controller searches for a second PGB in the set of memory components having a second subset of WGRs that are categorized as being non-defective. The controller computes a total quantity of WGRs based on the first quantity of WGRs in the first subset of WGRs and a second quantity of WGRs in the second subset of WGRs and, in response, combines the first PGB and the second PGB to form an individual virtual block.

19 Claims, 6 Drawing Sheets

(58) Field of Classification Search
CPC ............... G06F 3/00; G06F 3/06–0689; G06F 5/00–16; G06F 8/00–78; G06F 9/00–548; G06F 11/00–3696; G06F 12/00–16; G06F 13/00–4295; G06F 15/00–825; G06F 16/00–986; G06F 18/00–41; G06F 17/00–40; G06F 21/00–88; G06F 2009/3883; G06F 2009/45562–45595; G06F 2015/761–768; G06F 2201/00–885; G06F 2206/00–20; G06F 2209/00–549; G06F 2211/00–902; G06F 2212/00–7211; G06F 2213/00–4004; G06F 2216/00–17; G06F 2221/00–2153; G06N 3/00–126; G06N 5/00–048; G06N 7/00–08; G06N 10/00; G06N 20/00–20; G06N 99/00–007; G06T 1/00–60; G06V 30/00–43; G11B 20/00–24; G11B 33/00–1493; G11C 11/00–5692; G11C 13/00–06; G11C 14/00–009; G11C 15/00–06; G11C 16/00–3495; G11C 17/00–18; G11C 2207/00–229; G11C 2216/00–30; H01L 25/00–50; H01L 2225/00–1094; H03M 7/00–707; H04L 9/00–38; H04L 12/00–66; H04L 41/00–5096; H04L 49/00–9094; H04L 61/00–59; H04L 67/00–75

See application file for complete search history.

(56) References Cited

U.S. PATENT DOCUMENTS

| | | | | |
|---|---|---|---|---|
| 10,949,123 | B2* | 3/2021 | Parker | G06F 12/0804 |
| 11,061,768 | B1 | 7/2021 | Alrod et al. | |
| 2010/0082888 | A1 | 4/2010 | Mitsunaga et al. | |
| 2011/0209028 | A1* | 8/2011 | Post | G06F 12/0246 |
| | | | | 711/E12.001 |
| 2012/0096217 | A1* | 4/2012 | Son | G06F 12/0246 |
| | | | | 711/E12.008 |
| 2012/0173797 | A1* | 7/2012 | Shen | G06F 12/0246 |
| | | | | 711/E12.008 |
| 2013/0336059 | A1* | 12/2013 | Lee | G11C 29/82 |
| | | | | 365/185.11 |
| 2015/0187442 | A1* | 7/2015 | Sivasankaran | G11C 29/82 |
| | | | | 365/185.09 |
| 2015/0378884 | A1* | 12/2015 | Nemazie | G06F 12/0238 |
| | | | | 711/5 |
| 2016/0266955 | A1 | 9/2016 | Takeda et al. | |
| 2017/0090762 | A1 | 3/2017 | Ea et al. | |
| 2017/0286286 | A1* | 10/2017 | Szubbocsev | G06F 12/0246 |
| 2018/0129600 | A1* | 5/2018 | Ishiyama | G06F 11/1076 |
| 2018/0217892 | A1* | 8/2018 | Syu | G11C 29/44 |
| 2018/0342304 | A1 | 11/2018 | Dunga et al. | |
| 2018/0357160 | A1* | 12/2018 | Gorobets | G06F 3/064 |
| 2018/0373431 | A1* | 12/2018 | Kathawala | G06F 3/0619 |
| 2019/0205043 | A1* | 7/2019 | Huang | G06F 12/1009 |
| 2019/0304562 | A1* | 10/2019 | Cai | G11C 29/38 |
| 2020/0042201 | A1* | 2/2020 | Huang | G06F 3/065 |
| 2021/0365200 | A1 | 11/2021 | Alwala | |
| 2022/0066894 | A1 | 3/2022 | Namala et al. | |
| 2022/0199189 | A1 | 6/2022 | Namala et al. | |
| 2022/0413699 | A1* | 12/2022 | Luo | G06F 11/07 |

OTHER PUBLICATIONS

Machine translation of TW-201122812-A (Year: 2011).*
Definition of "transfgess"; Merriam-Webster Dictionary; retrieved from https://www.merriam-webster.com/dictionary/transgressed on Dec. 10, 2024 (Year: 2024).*
M. -C. Yang, Y. -H. Chang, C. -W. Tsao and C. -Y. Liu, "Utilization-Aware Self-Tuning Design for TLC Flash Storage Devices, " in IEEE Transactions on Very Large Scale Integration (VLSI) Systems, vol. 24, No. 10, pp. 3132-3144, Oct. 2016, doi: 10.1109/TVLSI.2016.2538182. (Year: 2016).*
"International Application Serial No. PCT US2024 011443, International Search Report mailed May 3, 2024", 3 pages.
"International Application Serial No. PCT US2024 011443, Written Opinion mailed May 3, 2024", 3 pages.
U.S. Appl. No. 18/788,730, filed Jul. 30, 2024, Mixed-Mode Virtual Block Generation.
"International Application Serial No. PCT/US2024/040175, International Search Report mailed Nov. 11, 2024", 4 pgs.
"International Application Serial No. PCT/US2024/040175, Written Opinion mailed Nov. 11, 2024", 5 pgs.

* cited by examiner

GENERATING VIRTUAL BLOCKS USING PARTIAL GOOD BLOCKS

PRIORITY APPLICATION

This application claims the benefit of priority to U.S. Provisional Application Ser. No. 63/441,342, filed Jan. 26, 2023, which is incorporated herein by reference in its entirety.

TECHNICAL FIELD

Embodiments of the disclosure relate generally to memory sub-systems and, more specifically, to providing adaptive media management for memory components, such as memory dies.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data on the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure configure a system component, such as a memory sub-system controller, to combine multiple partial good blocks (PGBs) to form one or more virtual blocks (VBs). The memory sub-system controller can access configuration data associated with a set of memory components. The configuration data can include a table that associates different word line groups (WGRs) of blocks of the memory components with indications of whether the WGRs are defective or non-defective. Based on the configuration data (which can be stored on the memory components and/or a memory of the controller), the controller can identify those PGBs that have a minimum quantity or percentage of WGRs that are non-defective. The controller can then combine multiple such PGBs to form one or more VBs. This improves the overall efficiency of operating the memory sub-system by utilizing memory blocks even if they contain some defective WGRs.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices (e.g., memory dies) that store data. The host system can send access requests (e.g., write command, read command) to the memory sub-system, such as to store data at the memory sub-system and to read data from the memory sub-system. The data (or set of data) specified by the host is hereinafter referred to as "host data," "application data," or "user data".

The memory sub-system can initiate media management operations, such as a write operation, on host data that is stored on a memory device. For example, firmware of the memory sub-system may re-write previously written host data from a location on a memory device to a new location as part of garbage collection management operations. The data that is re-written, for example as initiated by the firmware, is hereinafter referred to as "garbage collection data". "User data" can include host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

Many different media management operations can be performed on the memory device. For example, the media management operations can include different scan rates, different scan frequencies, different wear leveling, different read disturb management, different near miss error correction (ECC), and/or different dynamic data refresh. Wear leveling ensures that all blocks in a memory component approach their defined erase-cycle budget at the same time, rather than some blocks approaching it earlier. Read disturb management counts all of the read operations to the memory component. If a certain threshold is reached, the surrounding regions are refreshed. Near-miss ECC refreshes all data read by the application that exceeds a configured threshold of errors. Dynamic data-refresh scan reads all data and identifies the error status of all blocks as a background operation. If a certain threshold of errors per block or ECC unit is exceeded in this scan-read, a refresh operation is triggered.

A memory device can be a non-volatile memory device. A non-volatile memory device is a package of one or more dice (or dies). Each die can be comprised of one or more planes. For some types of non-volatile memory devices (e.g., NAND devices), each plane is comprised of a set of physical blocks. For some memory devices, blocks are the smallest area that can be erased. Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which is a raw memory device combined with a local embedded controller for memory management within the same memory device package.

Typical memory systems leverage VBs, also referred to as superblocks, which are a collection of blocks across multiple memory planes and/or dies. Namely, each superblock can be of equal size and can include a respective collection of blocks across multiple planes and/or dies. The superblocks, when allocated, allow a controller to simultaneously write data to a large portion of memory spanning multiple blocks (across multiple planes and/or dies) with a single address. The VBs are usually made up of blocks from an upper deck and a lower deck of the WGRs of the memory components. If any WGR in the upper deck is defective, the conventional systems can utilize the WGRs from the lower deck or vice versa. This can avoid wasting memory resources. However, if both the upper deck and the lower deck have WGRs that are defective, the entire block that is formed by the upper deck and lower deck is discarded and marked as unusable to form a VB. This can reduce the efficiency of generating superblocks because less memory space is available for forming superblocks. This can result in poor or unreliable memory performance.

Aspects of the present disclosure address the above and other deficiencies by providing a memory controller that can combine multiple PGBs to form one or more VBs even in cases where a defective WGR is present on the upper and lower decks of the memory components. The memory sub-system controller can access configuration data associated with a set of memory components. The configuration data can include a table that associates different WGRs of blocks of the memory components with indications of whether the WGRs are defective or non-defective. Based on the configuration data, the controller can identify those PGBs that have a reference or minimum quantity or percentage (e.g., 30%) of WGRs that are non-defective. The controller can then combine multiple such PGBs to form one or more VBs. This improves the overall efficiency of operating the memory sub-system by utilizing memory blocks even if they contain some defective WGRs.

In some examples, the memory controller identifies a first PGB in the set of memory components. The first PGB can have first subset of WGRs that are categorized as being non-defective. The memory controller searches for a second PGB in the set of memory components having a second subset of WGRs that are categorized as being non-defective. The memory controller computes a total quantity of WGRs based on the first quantity of WGRs in the first subset of WGRs and a second quantity of WGRs in the second subset of WGRs. The memory controller, in response to determining that the total quantity of WGRs corresponds to a threshold quantity of WGRs, combines the first PGB and the second PGB to form an individual virtual block.

In some examples, the memory controller accesses configuration data. The configuration data includes a table that associates different WGRs of blocks of the set of memory components with respective categories being indicative of a type of defect in the different WGRs. In some examples, the type of defect includes recoverable and non-recoverable defects. Recoverable defects can include at least one of word line (WL) to WL shorts, open WL, a slow to program WL, or a WL that fails to satisfy read bit error rate thresholds. Non-recoverable defects can include at least one of word line (WL) to pillar shorts, source-to-gate (SG) shorts, or dummy WL shorts.

In some examples, the first and second subsets of WGRs are each associated with recoverable defects. In some examples, the memory controller stores the table in a one-time program area of the memory sub-system, the table identifying an individual block address and a list of WGRs that are defective. In some examples, the individual VB includes a superblock that is distributed across multiple memory dies. In some examples, the individual VB includes a superblock that is distributed across multiple memory planes. In some examples, the memory controller stores a table. The table includes a first entry associating a first set of blocks of the first PGB and a second set of blocks of the second PGB with a first virtual block address.

In some examples, the memory controller generates a list of PGBs based on the configuration data. In some examples, the memory controller generates the list of PGBs by computing a quantity of non-defective WGRs in an individual block of the set of memory components. The memory controller determines that a percentage of non-defective WGRs of the individual block transgresses a threshold percentage of WGRs and adds the individual block to the list of PGBs. In some examples, the memory controller adds the individual block to the list of PGBs by storing an address of the individual block and identification of the WGRs that are defective.

In some examples, the memory controller generates the list of PGBs by computing a quantity of non-defective WGRs in an individual block of the set of memory components and determining that a percentage of non-defective WGRs of the individual block fails to transgress a threshold percentage of WGRs; and excluding the individual block from the list of PGBs.

In some examples, the memory controller determining that the total quantity of WGRs fails to correspond to the threshold quantity of WGRs. The memory controller searches for a third PGB in the set of memory components having a third subset of WGRs that are categorized as being non-defective and computes the total quantity of WGRs as a function of the first quantity of WGRs in the first subset of WGRs, the second quantity of WGRs in the second subset of WGRs, and a third quantity of WGRs in the third subset of WGRs. The memory controller, in response to determining that the total quantity of WGRs corresponds to the threshold quantity of WGRs, forms the individual virtual block using a combination of the first PGB, the second PGB, and the third PGB.

In some examples, the memory controller determines that an individual PGB of the individual virtual block begins to fail. The memory controller, in response to determining that the individual PGB of the individual virtual block begins to fail, replaces the individual PGB with a spare PGB having an individual subset of WGRs that are categorized as being non-defective corresponding to a quantity of WGRs in the individual PGB to repair the individual virtual block. In some examples, the memory controller determines that the individual PGB begins to fail in response to determining that a read bit error rate (RBER) associated with the individual PGB transgresses a threshold RBER.

Though various embodiments are described herein as being implemented with respect to a memory sub-system (e.g., a controller of the memory sub-system), some or all of the portions of an embodiment can be implemented with respect to a host system, such as a software application or an operating system of the host system.

Figure 1:
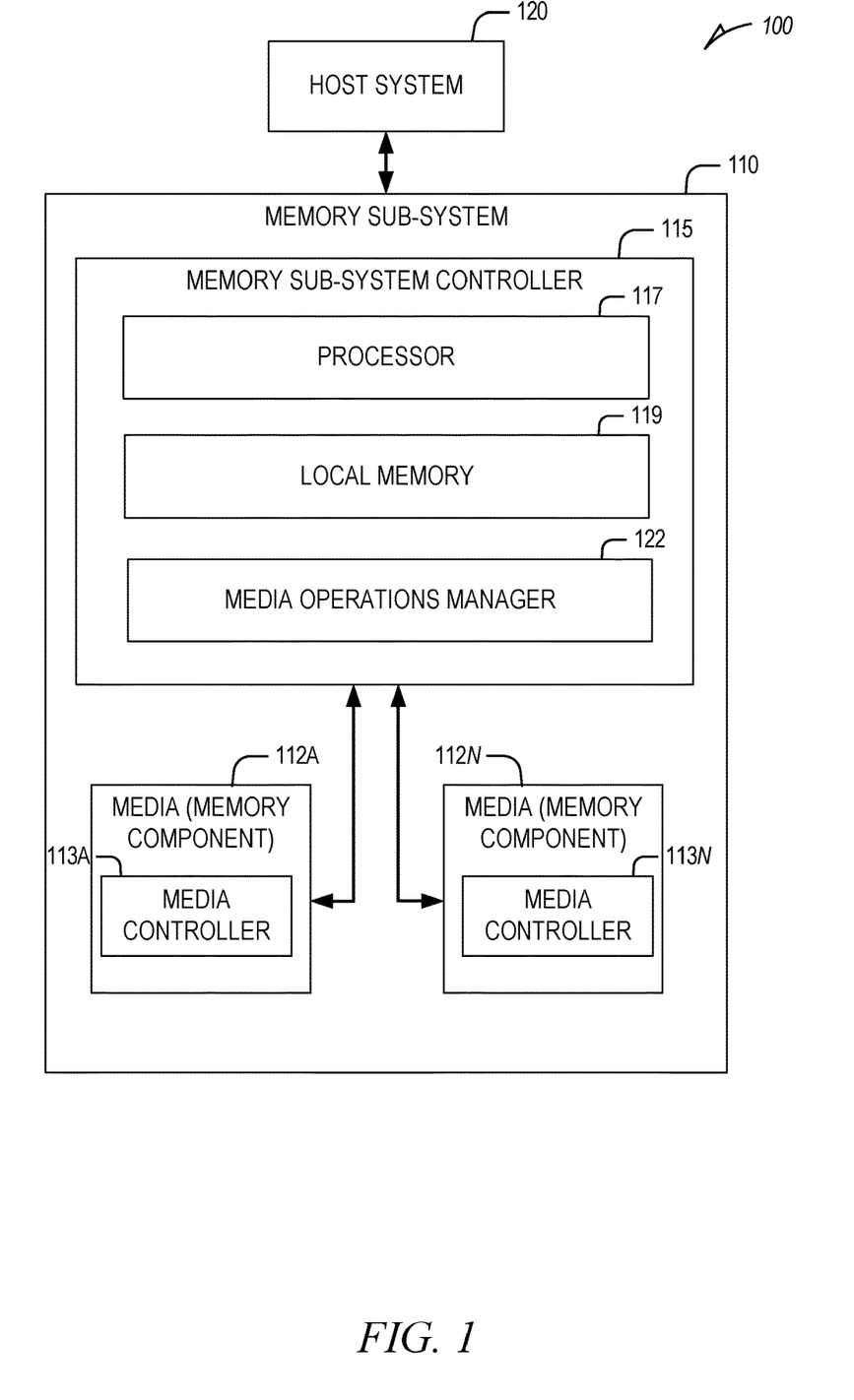
FIG. 1 is a block diagram illustrating an example computing environment including a memory sub-system, in accordance with some embodiments of the present disclosure.

FIG. 1 illustrates an example computing environment 100 including a memory sub-system 110, in accordance with some examples of the present disclosure. The memory sub-system 110 can include media, such as memory components 112A to 112N (also hereinafter referred to as "memory devices"). The memory components 112A to 112N can be volatile memory devices, non-volatile memory devices, or a combination of such. The memory components 112A to 112N can be implemented by individual dies, such that a first memory component 112A can be implemented by a first memory die (or a first collection of memory dies) and a second memory component 112N can be implemented by a second memory die (or a second collection of memory dies).

In some examples, the first memory component 112A, block or page of the first memory component 112A, or group of memory components including the first memory component 112A can be associated with a first reliability (capability) grade, value or measure. The terms "reliability grade," "value" and "measure" are used interchangeably throughout and can have the same meaning. The second memory component 112N or group of memory components including the second memory component 112N can be associated with a second reliability (capability) grade, value or measure. In some examples, each memory component 112A to 112N can store respective configuration data that specifies the respective reliability grade. In some examples, a memory or register can be associated with all of the memory components 112A to 112N, which can store a table that maps different groups, bins or sets of the memory components 112A to 112N to respective reliability grades.

In some embodiments, a PGB within the first memory component 112A can be grouped with a PGB within the second memory component 112N to form a superblock or VB that has a predetermined, reference or threshold quantity of blocks and WGRs. VBs can be addressed collectively using a single address. In such cases, a logical to physical address (LTP or L2P) table can store the association between the single address and each of the PGBs of the first memory component 112A and second memory component 112N associated with that single address. In some examples, some of the WGRs of the a given block within the first memory component 112A can have reliability grades that are below a threshold or can be characterized as defective or non-defective. Such blocks can be processed to determine whether a quantity of the WGRs that are non-defective relative to the total quantity of WGRs of the block is greater a minimum or reference percentage threshold. Alternatively, or in addition, such blocks can be processed to determine whether a quantity of the WGRs that are defective relative to the total quantity of WGRs of the block is below a minimum or reference percentage threshold. If the quantity of the WGRs that are non-defective relative to the total quantity of WGRs of the block is greater a minimum or reference percentage threshold, such as block is marked as a PGB and can be used to form a VB. A memory or table can be generated to list the PGBs and their respective WGRs that are defective or non-defective.

In some embodiments, the memory sub-system 110 is a storage system. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND)-type flash memory. Each of the memory components 112A to 112N can include one or more arrays of memory cells such as single-level cells (SLCs) or multi-level cells (MLCs) (e.g., TLCs or QLCs). In some embodiments, a particular memory component 112 can include both an SLC portion and an MLC portion of memory cells. Each of the memory cells can store one or more bits of data (e.g., blocks) used by the host system 120. Although non-volatile memory components such as NAND-type flash memory are described, the memory components 112A to 112N can be based on any other type of memory, such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magnetoresistive random access memory (MRAM), negative-or (NOR) flash memory, electrically erasable programmable read-only memory (EEPROM), and a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages or blocks that can refer to a unit of the memory component 112 used to store data. For example, a single first row that spans memory components 112A to 112N can correspond to or be grouped as a first superblock and a single second row that spans memory components 112A to 112N can correspond to or be grouped as a second superblock. If the single first row includes all good blocks (e.g., each block in the single first row has a reliability grade above a threshold), the first superblock is a first complete superblock. If the single first row includes some bad blocks (e.g., one or more blocks in the single first row have a reliability grade below a threshold), the first superblock is a first incomplete superblock.

The memory sub-system controller 115 can communicate with the memory components 112A to 112N to perform memory operations such as reading data, writing data, or erasing data at the memory components 112A to 112N and other such operations. The memory sub-system controller 115 can communicate with the memory components 112A to 112N to perform various memory management operations, such as different scan rates, different scan frequencies, different wear leveling, different read disturb management, different near miss ECC operations, and/or different dynamic data refresh.

The memory sub-system controller 115 can include hardware such as one or more integrated circuits and/or discrete components, a buffer memory, or a combination thereof. The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, and so forth. The local memory 119 can also include read-only memory (ROM) for storing microcode. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor 117 or controller separate from the memory sub-system 110).

In general, the memory sub-system controller 115 can receive commands or operations from the host system 120 and can convert the commands or operations into instructions or appropriate commands to achieve the desired access to the memory components 112A to 112N. In some examples, the commands or operations received from the host system 120 can specify configuration data for the memory components 112N to 112N. The configuration data can describe the reliability grades and/or indications of defects in certain WGRs associated with different groups of the memory components 112N to 112N and/or different blocks within each of the memory components 112N to 112N. In some cases, the reliability grades are dynamic and can be updated by the memory sub-system controller 115 in response to determining that certain error rates are reached that transgress an error rate threshold. For example, a non-defective WGRs can become a defective WGRs if that non-defective WGRs starts having error rates that transgress the threshold. In such cases, the configuration data is updated and any VB that includes that now defective WGRs is updated with a replacement or spare PGB to maintain performance of the VB above a minimum or reference performance rating.

The memory sub-system controller 115 can be responsible for other memory management operations, such as wear leveling operations, garbage collection operations, error detection and error-correcting code (ECC) operations, encryption operations, caching operations, and address translations. The memory sub-system controller 115 can further include host interface circuitry to communicate with the host system 120 via the physical host interface. The host interface circuitry can convert the commands received from the host system 120 into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM or other temporary storage location or device) and address circuitry (e.g., a row decoder and a column decoder) that can receive an address from the memory sub-system controller 115 and decode the address to access the memory components 112A to 112N.

The memory devices can be raw memory devices (e.g., NAND), which are managed externally, for example, by an external controller (e.g., memory sub-system controller 115). The memory devices can be managed memory devices (e.g., managed NAND), which is a raw memory device combined with a local embedded controller (e.g., local media controllers) for memory management within the same memory device package. Any one of the memory components 112A to 112N can include a media controller (e.g., media controller 113A and media controller 113N) to manage the memory cells of the memory component (e.g., to perform one or more memory management operations), to communicate with the memory sub-system controller 115, and to execute memory requests (e.g., read or write) received from the memory sub-system controller 115.

The memory sub-system controller 115 can include a media operations manager 122. The media operations manager 122 can be configured to combine multiple PGBs to form one or more VBs. The memory sub-system controller 115 can access configuration data associated with a set of memory components. The configuration data can include a table that associates different WGRs of blocks of the memory components with indications of whether the WGRs are defective or non-defective. Based on the configuration data, the memory sub-system controller 115 can identify those PGBs that have a reference or minimum quantity or percentage (e.g., 30%) of WGRs that are non-defective. The memory sub-system controller 115 can then combine multiple such PGBs to form one or more VBs. This improves the overall efficiency of operating the memory sub-system by utilizing memory blocks even if they contain some defective WGRs. This increases the efficiency of operating memory systems.

As an example, the media operations manager 122 can identify a first PGB in the set of memory components 112. The first PGB can have first subset of WGRs that are categorized as being non-defective. The media operations manager 122 searches for a second PGB in the set of memory components having a second subset of WGRs that are categorized as being non-defective. The media operations manager 122 computes a total quantity of WGRs based on the first quantity of WGRs in the first subset of WGRs and a second quantity of WGRs in the second subset of WGRs. The media operations manager 122, in response to determining that the total quantity of WGRs corresponds to a threshold quantity of WGRs, combines the first PGB and the second PGB to form an individual virtual block.

Depending on the embodiment, the media operations manager 122 can comprise logic (e.g., a set of transitory or non-transitory machine instructions, such as firmware) or one or more components that causes the media operations manager 122 to perform operations described herein. The media operations manager 122 can comprise a tangible or non-tangible unit capable of performing operations described herein. Further details with regards to the operations of the media operations manager 122 are described below.

Figure 2:
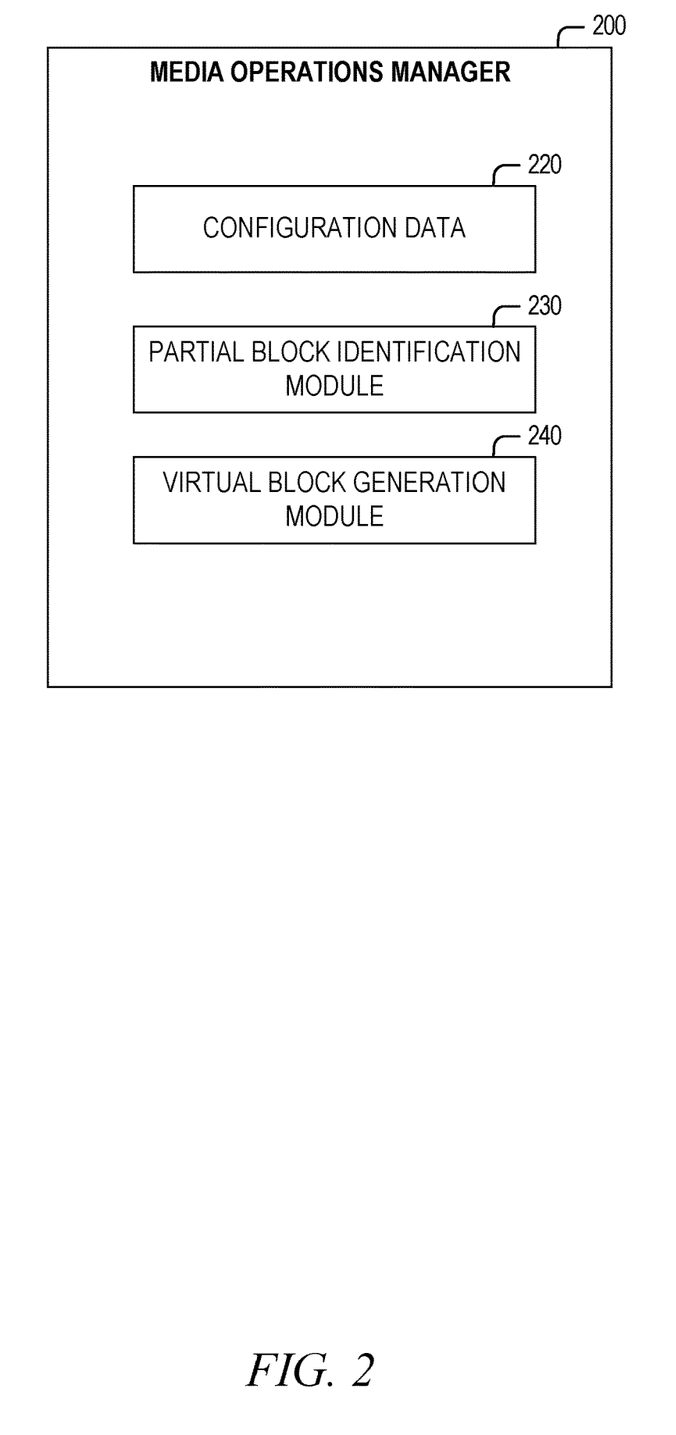
FIG. 2 is a block diagram of an example media operations manager, in accordance with some implementations of the present disclosure.

FIG. 2 is a block diagram of an example media operations manager 200, in accordance with some implementations of the present disclosure. The media operations manager 200 can include some or all of the components of the media operations manager 122, shown in FIG. 1. As illustrated, the media operations manager 122 includes configuration data 220, a partial block identification module 230, and a virtual block generation module 240. For some embodiments, the media operations manager 122 can differ in components or arrangement (e.g., less or more components) from what is illustrated in FIG. 2.

The configuration data 220 accesses and/or stores configuration data associated with the memory components 112A to 112N. In some examples, the configuration data 220 is programmed into the media operations manager 122 during manufacture of the memory sub-system 110. The media operations manager 122 can communicate with the memory components 112A to 112N to obtain the configuration data and store the configuration data 220 locally on the media operations manager 122. In some examples, the media operations manager 122 communicates with the host system 120. The host system 120 receives input from an operator or user that specifies parameters including indications of defects present on different WGRs, different bins, groups, blocks, or sets of the memory components 112A to 112N. The media operations manager 122 receives configuration data from the host system 120 and stores the configuration data in the configuration data 220.

In some examples, the media operations manager 122 performs one or more test operations on different groups or blocks of the memory components 112A to 112N. The test operations are configured to determine and detect which WGRs have recoverable defects (are non-defective) and which WGRs have non-recoverable defects (are defective) of each block of the memory components 112A to 112N. Recoverable defects include at least one of word line (WL) to WL shorts, open WL, a slow to program WL, or a WL that fails to satisfy read bit error rate thresholds. Non-recoverable defects include at least one of word line (WL) to pillar shorts, source-to-gate (SG) shorts, or dummy WL shorts.

Based on a result of the test operations, the media operations manager 122 can store or update the PGB identified in the configuration data 220. In some examples, the media operations manager 122 can periodically or routinely perform the test operations to update which WGRs change from being non-defective to being defective resulting in failure of the PGB. The configuration data 220 can also store a reference or minimum threshold percentage of non-defective WGRs an individual block can have to be usable as a PGB.

In some examples, the partial block identification module 230 accesses the configuration data 220 to generate a list of PGBs. In such cases, the partial block identification module 230 can obtain from the configuration data 220 the list of WGRs and their respective indications of types of defects (e.g., recoverable or non-recoverable). The partial block identification module 230 can determine for an individual block the quantity of WGRs having recoverable defects. The partial block identification module 230 can compute the total quantity of WGRs (having the recoverable and non-recoverable defects) of the individual block. The partial block identification module 230 can compute a ratio or percentage of the quantity of WGRs having recoverable defects to the total quantity of WGRs. The partial block identification module 230 can obtain the reference or minimum threshold percentage of non-defective WGRs an individual block can have to be usable as a PGB from the configuration data 220. The partial block identification module 230 can determine that the ratio or percentage of the quantity of WGRs having recoverable defects to the total quantity of WGRs transgresses the reference or minimum threshold percentage of non-defective WGRs (e.g., 30%). In such cases, the partial block identification module 230 can add the individual block to a list of PGBs by storing an address of the block corresponding to the PGB and the list of WGRs having non-recoverable defects or that are defective. If the ratio or percentage of the quantity of WGRs having recoverable defects to the total quantity of WGRs fails to transgress the reference or minimum threshold percentage, the individual block is discarded and is excluded from the list of PGBs to avoid using the block as a PGB used to form a VB.

The partial block identification module 230 can continue processing all of the blocks of the memory components 112A-112N in a similar manner to compile a list of all PGBs for which a quantity of WGRs that are non-defective relative to a total number of WGRs transgresses a reference or threshold percentage. In some examples, in response to determining that the ratio or percentage of the quantity of WGRs having recoverable defects to the total quantity of WGRs transgresses the reference or minimum threshold percentage of non-defective WGRs (e.g., 30%), the partial block identification module 230 can perform additional reliability tests on the remaining WGRs that are non-defective. The partial block identification module 230 can determine that the remaining WGRs of the individual block pass the additional reliability tests. For example, the partial block identification module 230 can determine that a read bit error rate (RBER) RBER for the WGRs that are non-defective is below a reference RBER. If the remaining WGRs of the individual block pass the additional reliability tests, the PGB is maintained or added to the list of PGBs. If the remaining WGRs of the individual block fail the additional reliability tests, the individual block is discarded and is excluded from the list of PGBs to avoid using the block as a PGB used to form a VB.

After the list of PGBs is generated, the virtual block generation module 240 can access the list of PGBs to form one or more VBs using different groups of PGBs that are in the list. For example, the virtual block generation module 240 can determine a minimum or reference quantity of WGRs needed to form an individual VB. The virtual block generation module 240 can then search the list of PGBs to identify multiple PGBs that can be selected to form the individual VB. Particularly, the virtual block generation module 240 can select a first PGB from the list of PGBs. The virtual block generation module 240 can determine how many non-defective WGRs are included in the first PGB. The virtual block generation module 240 can subtract or compare a first quantity of non-defective WGRs are included in the first PGB to the minimum or reference quantity of WGRs needed to form an individual VB. In response to determining that the first quantity of non-defective WGRs are included in the first PGB is less than the minimum or reference quantity of WGRs needed to form an individual VB, the virtual block generation module 240 searches for another PGB in the list of PGBs.

In some examples, the virtual block generation module 240 can compute a fraction or percentage of the minimum or reference quantity of WGRs needed to form an individual VB that is satisfied by the first quantity of non-defective WGRs are included in the first PGB. For example, the virtual block generation module 240 can determine that the first quantity of non-defective WGRs are included in the first PGB can be used to complete 30% of the WGRs of the individual VB. In such cases, the virtual block generation module 240 can search the list of PGBs to find a second PGB having a quantity of WGRs that can be used to complete the remaining portions of the WGRs of the individual VB. For example, the virtual block generation module 240 can search for a PGB that can be used to fill 70% of the WGRs of the individual VB. In some cases, the virtual block generation module 240 can determine the quantity of WGRs missing from the VB by deducting the first quantity of non-defective WGRs from the minimum or reference quantity of WGRs. The virtual block generation module 240 can search the list of PGBs to find the second PGB having the quantity of WGRs missing from the VB or less.

The virtual block generation module 240 can select the second PGB for use in forming the individual VB. The virtual block generation module 240 can combine or add the quantity of WGRs of the first PGB with the quantity of WGRs in the second PGB. The virtual block generation module 240 can determine whether the total quantity of WGRs of the first and second PGBs that are non-defective transgress or correspond to the minimum or reference quantity of WGRs needed to form an individual VB. If so, the virtual block generation module 240 updates the L2P table to store the addresses of the first and second PGBs in association with an address of the individual VB. If not, the virtual block generation module 240 searches for a third PGB that has a quantity of WGRs that are missing from the minimum or reference quantity of WGRs needed to form an individual VB. The virtual block generation module 240 can then, once the third PGB is found, determine whether the total quantity of WGRs of the first, second and third PGBs that are non-defective transgress or correspond to the minimum or reference quantity of WGRs needed to form an individual VB. If so, the virtual block generation module 240 updates the L2P table to store the addresses of the first, second and third PGBs in association with the address of the individual VB.

Figure 3:
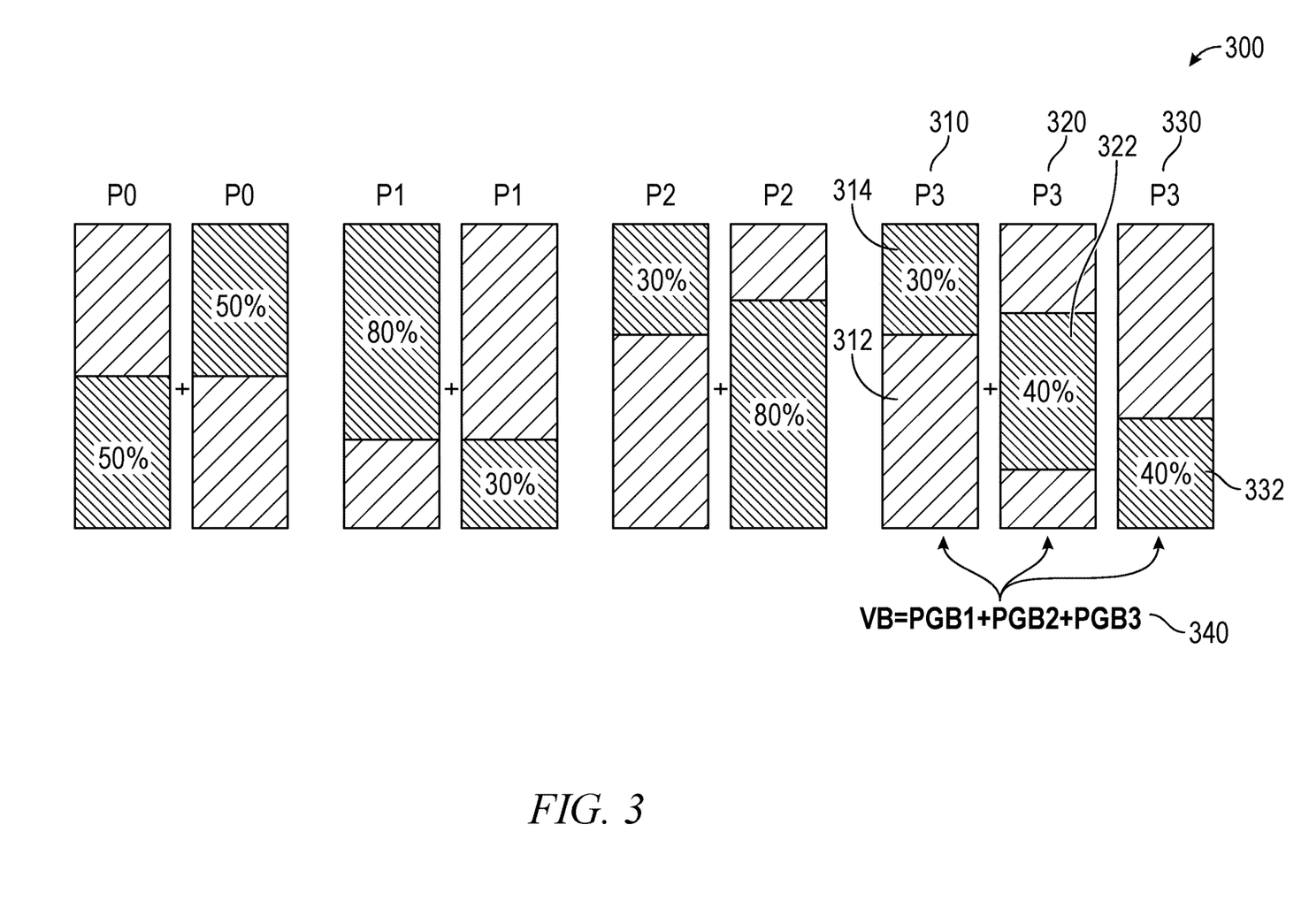
FIG. 3 is a block diagram of an example plurality of virtual blocks made up of partial good blocks (PGBs), in accordance with some implementations of the present disclosure.

FIG. 3 is a block diagram of an example plurality of VBs 300 made up of PGBs, in accordance with some implementations of the present disclosure. For example, the plurality of VBs 300 can be formed of multiple planes (P0, P1, P2, and P3) of an individual memory die. As shown, a first VB 340 can be formed by combining a first subset of WGRs 314 of a first PGB 310 on a given plane. The first subset of WGRs 314 can be non-defective. The first PGB 310 can include a second subset of WGRs 312 that are defective. The media operations manager 122 can compute a percentage based on the quantity of the first subset of WGRs 314 relative to a minimum or reference quantity of WGRs of the first VB 340. In this case, the media operations manager 122 can determine that the first PGB 310 includes 30% of the WGRs of the minimum or reference quantity of WGRs of the first VB 340. In such cases, the media operations manager 122 searches for a second PGB 320 on the same or different plane of the memory die.

The second PGB 320 can include a second set of WGRs 322 that are non-defective. The media operations manager 122 can compute a percentage based on the quantity of the second subset of WGRs 322 relative to a minimum or reference quantity of WGRs of the first VB 340. In this case, the media operations manager 122 can determine that the second PGB 320 includes 40% of the WGRs of the minimum or reference quantity of WGRs of the first VB 340. The media operations manager 122 accumulates or adds the percentage of the first subset of WGRs 314 with the percentage of the second subset of the WGRs 322 to determine how many or how much percentage of WGRs is missing from the minimum or reference quantity of WGRs of the first VB 340. For example, the media operations manager 122 can determine that the first PGB 310 and the second PGB 320 include a total of WGRs that are non-defective that can be used to make up 70% of the total needed WGRs of the first VB 340. In such cases, the media operations manager 122 searches for a third PGB 330 on the same or different plane of the memory die.

The media operations manager 122 uses the WGRs 332 of the third PGB 330 that are non-defective to form the first VB 340 together with the WGRs 314 of the first PGB 310 and the WGRs 322 of the second PGB 320. The media operations manager 122 stores an identifier of the first PGB 310, second PGB 320, and the third PGB 330 in association with the address for the first VB 340. In some cases, the third PGB 330 includes more WGRs than needed or is missing to be combined with the WGRs 314 of the first PGB 310 and the WGRs 322 of the second PGB 320 to form the first VB 340. For example, the first VB 340 can be missing 30% of the WGRs when formed using the first PGB 310 and the second PGB 320 but the quantity of the WGRs of the third PGB 330 can correspond to 40% of the missing quantity of WGRs. In such cases, the media operations manager 122 can still use less than all of the WGRs (e.g., a quantity of WGRs of the third PGB 330 corresponding to 30% of the minimum or reference WGRs of the first VB 340) of the third PGB 330 to form the first VB 340. The remaining WGRs that are not used to form the first VB 340 which can correspond to 10% of the minimum or reference WGRs of the first VB 340, can be used as spare WGRs. These spare WGRs can be used to substitute WGRs of the first VB 340 that are determined to begin to fail, such as because the RBER of certain WGRs the first VB 340 reaches a threshold RBER. In such cases, the WGRs that reach the threshold RBER are removed from being used in the first VB 340 and are replaced with one or more of the WGRs that remained as spare WGRs of the third PGB 330.

Figure 4:
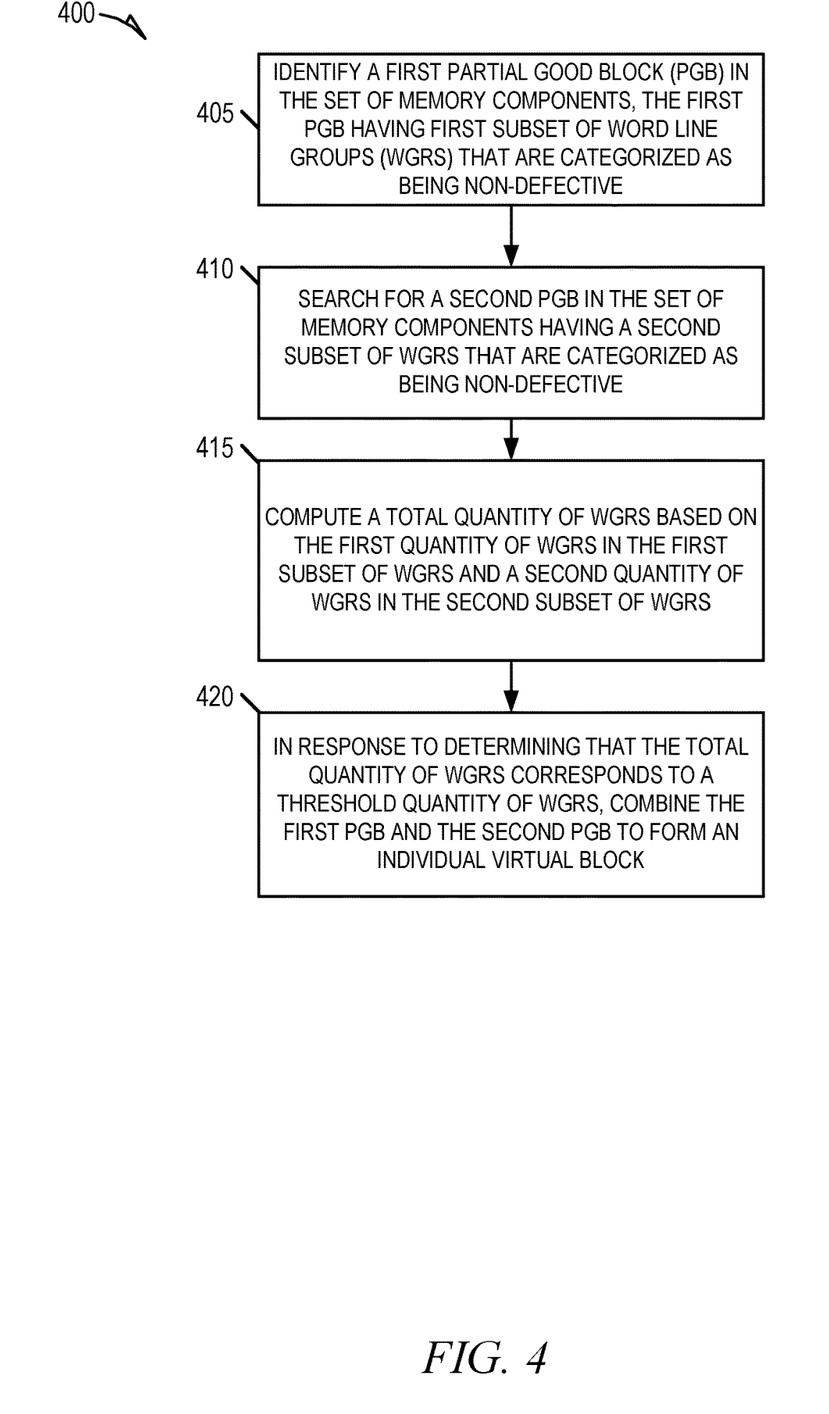
FIGS. 4 and 5 are flow diagrams of example methods to perform memory operations to generate virtual blocks from PGBs, in accordance with some implementations of the present disclosure.

FIG. 4 is a flow diagram of an example method 400 to perform memory operations to generate virtual blocks from PGBs, in accordance with some implementations of the present disclosure. The method 400 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 400 is performed by the media operations manager 122 of FIG. 1. Although the processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring now FIG. 4, the method (or process) 400 begins at operation 405, with a media operations manager 122 of a memory sub-system (e.g., memory sub-system 110) identifying a first partial good block (PGB) in the set of memory components, the first PGB having first subset of word line groups (WGRs) that are categorized as being non-defective. Then, at operation 410, the media operations manager 122 of the memory sub-system searches for a second PGB in the set of memory components having a second subset of WGRs that are categorized as being non-defective. Thereafter, at operation 415, the media operations manager 122 computes a total quantity of WGRs based on the first quantity of WGRs in the first subset of WGRs and a second quantity of WGRs in the second subset of WGRs. The media operations manager 122, at operation 420, in response to determining that the total quantity of WGRs corresponds to a threshold quantity of WGRs, combines the first PGB and the second PGB to form an individual virtual block.

Figure 5:
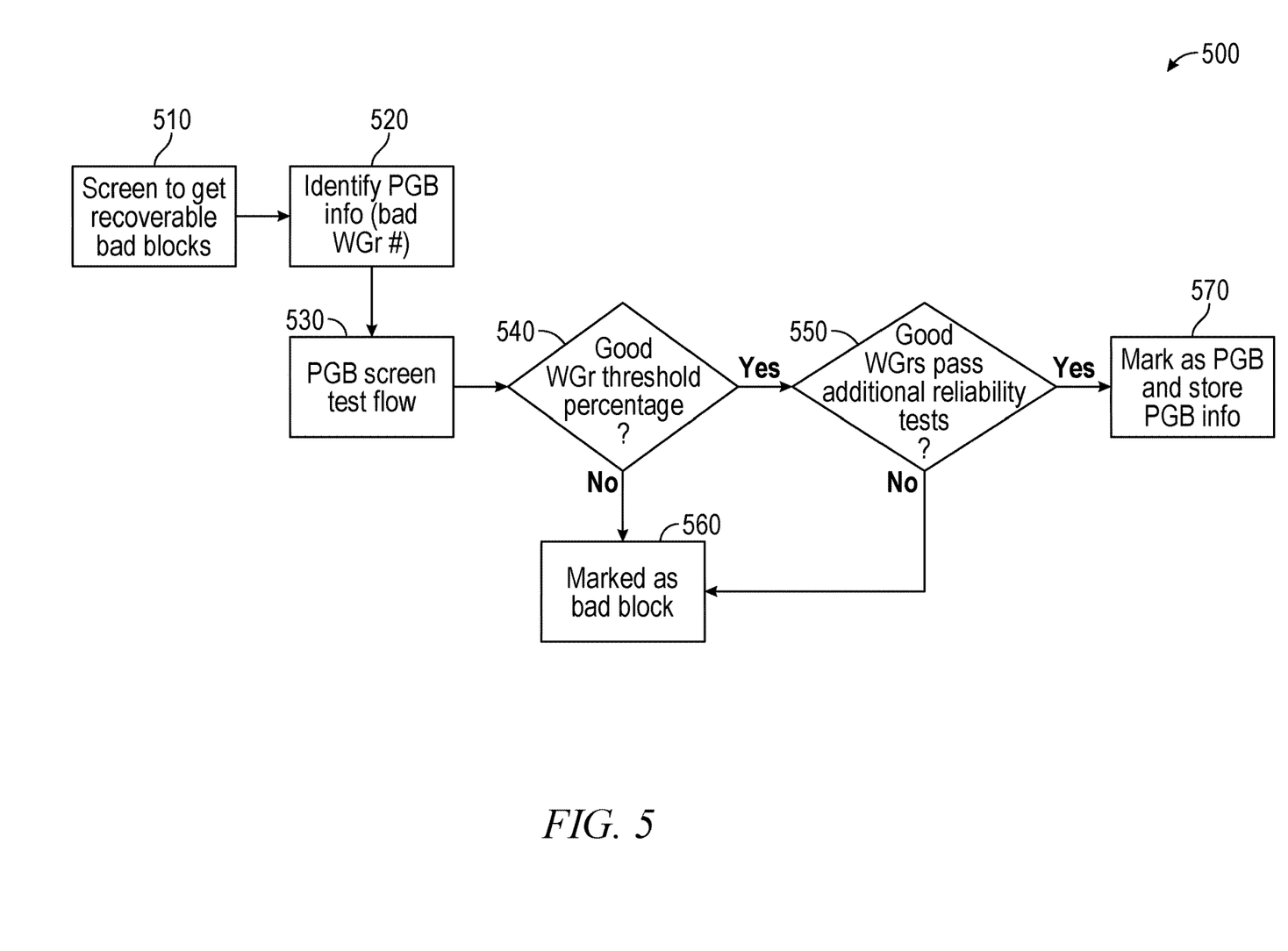

FIG. 5 is a flow diagram of an example method 500 to perform memory operations to generate virtual blocks from PGBs, in accordance with some implementations of the present disclosure. The method 500 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 500 is performed by the media operations manager 122 of FIG. 1. Although the processes are shown in a particular sequence or order, unless otherwise specified, the order of the processes can be modified. Thus, the illustrated embodiments should be understood only as examples. The illustrated processes can be performed in a different order, and some processes can be performed in parallel. Additionally, one or more processes can be omitted in various embodiments. Thus, not all processes are required in every embodiment. Other process flows are possible.

Referring now FIG. 5, the method (or process) 500 begins at operation 510, with a media operations manager 122 of a memory sub-system (e.g., memory sub-system 110) starting to screen configuration data to obtain a list of recoverable bad blocks of each individual block of the set of memory components 112A-112N. At operation 520, the media operations manager 122 identifies a PGB information including the list of defective WGRs of an individual block. The media operations manager 122, at operation 530, starts a screening test flow for selectively adding the individual block to a list of PGBs. Specifically, at operation 540; the media operations manager 122 determines whether a quantity or percentage of non-defective WGRs of the individual block transgresses a threshold percentage or quantity. If so, the media operations manager 122 continues to operation 550 where additional reliability tests are performed on the non-defective WGRs of the individual block. If the quantity or percentage of non-defective WGRs of the individual block fails to transgress the threshold percentage or quantity, the media operations manager 122 performs operation 560 where the individual block is marked as a bad block and is not used to form an individual VB.

At operation 550, the media operations manager 122 determines whether the non-defective WGRs of the individual block pass the additional reliability tests. If so, the media operations manager 122 continues to operation 570 the individual block is added to the list of PGBs with indications of which WGRs are defective or non-defective. If the non-defective WGRs of the individual block fail to pass the additional reliability tests, the media operations manager 122 performs operation 560 where the individual block is marked as a bad block and is not used to form an individual VB.

In view of the disclosure above, various examples are set forth below. It should be noted that one or more features of an example, taken in isolation or combination, should be considered within the disclosure of this application.

Example 1. A system comprising: a set of memory components of a memory sub-system; and a processing device operatively coupled to the set of memory components, the processing device being configured to perform operations comprising: identifying a first partial good block (PGB) in the set of memory components, the first PGB having first subset of word line groups (WGRs) that are categorized as being non-defective; searching for a second PGB in the set of memory components having a second subset of WGRs that are categorized as being non-defective; computing a total quantity of WGRs based on the first quantity of WGRs in the first subset of WGRs and a second quantity of WGRs in the second subset of WGRs; and in response to determining that the total quantity of WGRs corresponds to a threshold quantity of WGRs, combining the first PGB and the second PGB to form an individual virtual block.

Example 2. The system of Example 1, the operations comprising: accessing configuration data, wherein the configuration data comprises a table that associates different WGRs of blocks of the set of memory components with respective categories being indicative of a type of defect in the different WGRs.

Example 3. The system of Example 2, wherein the type of defect includes recoverable and non-recoverable defects.

Example 4. The system of Example 3, wherein recoverable defects include at least one of word line (WL) to WL shorts, open WL, a slow to program WL, or a WL that fails to satisfy read bit error rate thresholds.

Example 5. The system of any one of Examples 3-4, wherein the non-recoverable defects include at least one of word line (WL) to pillar shorts, source-to-gate (SG) shorts, or dummy WL shorts.

Example 6. The system of any one of Examples 3-5, wherein the first and second subsets of WGRs are each associated with recoverable defects.

Example 7. The system of any one of Examples 1-6, the operations comprising: storing the table in a one-time program area of the memory sub-system, the table identifying an individual block address and a list of WGRs that are defective.

Example 8. The system of any one of Examples 1-7, wherein the individual virtual block comprises a superblock that is distributed across multiple memory dies.

Example 9. The system of any one of Examples 1-8, wherein the individual virtual block comprises a superblock that is distributed across multiple memory planes.

Example 10. The system of any one of Examples 1-9, the operations comprising: storing a table, the table comprising a first entry associating a first set of blocks of the first PGB and a second set of blocks of the second PGB with a first virtual block address.

Example 11. The system of any one of Examples 1-10, the operations comprising: accessing configuration data, wherein the configuration data comprises a table that associates different WGRs of blocks of the set of memory components with respective categories being indicative of a type of defect in the different WGRs; and generating a list of PGBs based on the configuration data.

Example 12. The system of Example 11, the operations for generating the list of PGBs comprising: computing a quantity of non-defective WGRs in an individual block of the set of memory components; determining that a percentage of non-defective WGRs of the individual block transgresses a threshold percentage of WGRs; and adding the individual block to the list of PGBs.

Example 13. The system of Example 12, wherein adding the individual block to the list of PGBs comprises storing an address of the individual block and identification of the WGRs that are defective.

Example 14. The system of any one of Examples 11-13, the operations for generating the list of PGBs comprising: computing a quantity of non-defective WGRs in an individual block of the set of memory components; determining that a percentage of non-defective WGRs of the individual block fails to transgress a threshold percentage of WGRs; and excluding the individual block from the list of PGBs.

Example 15. The system of any one of Examples 1-14, the operations comprising: determining that the total quantity of WGRs fails to correspond to the threshold quantity of WGRs; searching for a third PGB in the set of memory components having a third subset of WGRs that are categorized as being non-defective; computing the total quantity of WGRs as a function of the first quantity of WGRs in the first subset of WGRs, the second quantity of WGRs in the second subset of WGRs, and a third quantity of WGRs in the third subset of WGRs; and in response to determining that the total quantity of WGRs corresponds to the threshold quantity of WGRs, forming the individual virtual block using a combination of the first PGB, the second PGB, and the third PGB.

Example 16. The system of any one of Examples 1-15, the operations comprising: determining that an individual PGB of the individual virtual block begins to fail; and in response to determining that the individual PGB of the individual virtual block begins to fail, replacing the individual PGB with a spare PGB having an individual subset of WGRs that are categorized as being non-defective corresponding to a quantity of WGRs in the individual PGB to repair the individual virtual block.

Example 17. The system of Example 16, wherein determining that the individual PGB begins to fail in response to determining that a read bit error rate (RBER) associated with the individual PGB transgresses a threshold RBER.

Methods and computer-readable storage medium with instructions for performing any one of the above Examples.

Figure 6:
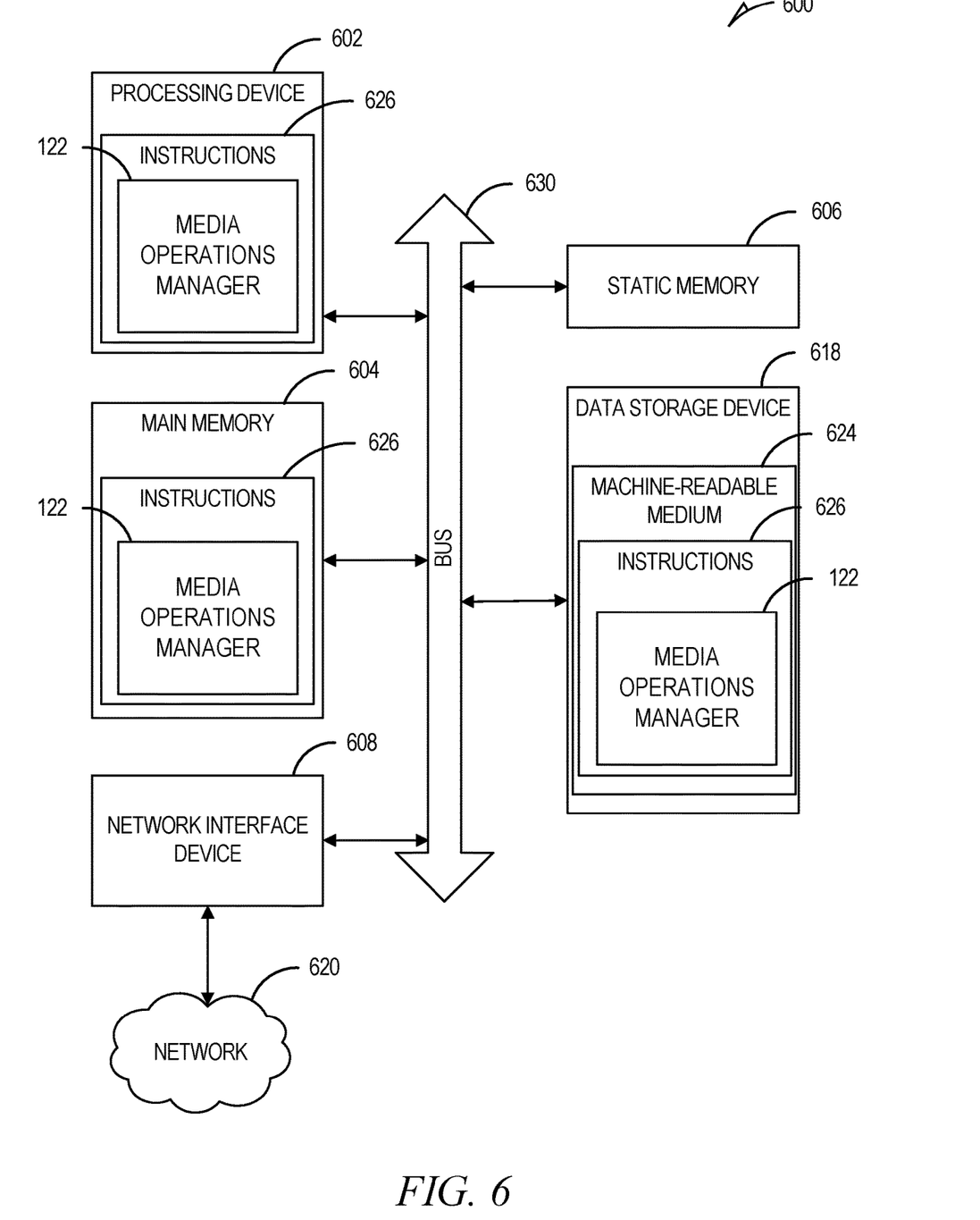
FIG. 6 is a block diagram illustrating a diagrammatic representation of a machine in the form of a computer system within which a set of instructions can be executed for causing the machine to perform any one or more of the methodologies discussed herein, in accordance with some embodiments of the present disclosure.

FIG. 6 illustrates an example machine in the form of a computer system 600 within which a set of instructions can be executed for causing the machine to perform any one or more of the methodologies discussed herein. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the media operations manager 122 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

The processing device 602 represents one or more general-purpose processing devices such as a microprocessor, a central processing unit, or the like. More particularly, the processing device 602 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), a network processor, or the like. The processing device 602 is configured to execute instructions 626 for performing the operations and steps discussed herein. The computer system 600 can further include a network interface device 608 to communicate over a network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 implement functionality corresponding to the media operations manager 122 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a set of memory components of a memory sub-system; and
a processing device operatively coupled to the set of memory components, the processing device being programmed to perform operations comprising:
identifying a first partial good block (PGB) in the set of memory components, the first PGB having a first subset of word line groups (WGRs) that are categorized as being non-defective;
computing a quantity of non-defective WGRs in an individual block of the set of memory components;
determining that a percentage of non-defective WGRs of the individual block exceeds a threshold percentage of WGRs;
adding the individual block to a list of PGBs, the individual block comprising the first PGB;
searching for a second PGB in the set of memory components having a second subset of WGRs that are categorized as being non-defective to meet the threshold quantity;
computing a total quantity of WGRs based on a first quantity of WGRs in the first subset of WGRs and a second quantity of WGRs in the second subset of WGRs; and
in response to determining that the total quantity of WGRs is greater than or equal to a threshold quantity of WGRs, combining the first PGB and the second PGB to form an individual virtual block.

2. The system of claim 1, the operations comprising:
accessing configuration data, wherein the configuration data comprises a table that associates different WGRs of blocks of the set of memory components with respective categories being indicative of a type of defect in the different WGRs.

3. The system of claim 2, wherein the type of defect includes recoverable and non-recoverable defects, the operations comprising in response to determining that a quantity of the first subset of WGRs that are categorized as being non-defective is less than the threshold quantity of WGRs associated with formation of the individual virtual block, triggering the search for the second PGB.

4. The system of claim 3, wherein recoverable defects include at least one of word line (WL) to WL shorts, open WL, a slow to program WL, or a WL that fails to satisfy read bit error rate thresholds.

5. The system of claim 3, wherein the non-recoverable defects include at least one of word line (WL) to pillar shorts, source-to-gate (SG) shorts, or dummy WL shorts.

6. The system of claim 3, wherein the first and second subsets of WGRs are each associated with recoverable defects.

7. The system of claim 2, the operations comprising:
storing the table in a one-time program area of the memory sub-system, the table identifying an individual block address and a list of WGRs that are defective.

8. The system of claim 1, wherein the individual virtual block comprises a superblock that is distributed across multiple memory dies, the operations comprising storing respective addresses of the first PGB and the second PGB with a single address associated with the superblock.

9. The system of claim 1, wherein the individual virtual block comprises a superblock that is distributed across multiple memory planes.

10. The system of claim 1, the operations comprising:
storing a table, the table comprising a first entry associating a first set of blocks of the first PGB and a second set of blocks of the second PGB with a first virtual block address.

11. The system of claim 1, the operations comprising:
accessing configuration data, wherein the configuration data comprises a table that associates different WGRs of blocks of the set of memory components with respective categories being indicative of a type of defect in the different WGRs; and
generating the list of PGBs based on the configuration data.

12. The system of claim 1, wherein adding the individual block to the list of PGBs comprises storing an address of the individual block and identification of the WGRs that are defective.

13. The system of claim 11, the operations for generating the list of PGBs comprising:
computing a quantity of non-defective WGRs in a given block of the set of memory components;
determining that a percentage of non-defective WGRs of the given block fails to exceed a threshold percentage of WGRs; and
excluding the given block from the list of PGBs.

14. The system of claim 1, the operations comprising:
determining that the total quantity of WGRs fails to correspond to the threshold quantity of WGRs;
searching for a third PGB in the set of memory components having a third subset of WGRs that are categorized as being non-defective;
computing the total quantity of WGRs as a function of the first quantity of WGRs in the first subset of WGRs, the second quantity of WGRs in the second subset of WGRs, and a third quantity of WGRs in the third subset of WGRs; and
in response to determining that the total quantity of WGRs corresponds to the threshold quantity of WGRs, forming the individual virtual block using a combination of the first PGB, the second PGB, and the third PGB.

15. The system of claim 1, the operations comprising:
determining that an individual PGB of the individual virtual block begins to fail; and
in response to determining that the individual PGB of the individual virtual block begins to fail, replacing the individual PGB with a spare PGB having an individual subset of WGRs that are categorized as being non-defective corresponding to a quantity of WGRs in the individual PGB to repair the individual virtual block.

16. The system of claim 15, wherein determining that the individual PGB begins to fail in response to determining that a read bit error rate (RBER) associated with the individual PGB exceeds a threshold RBER.

17. A method comprising:
identifying a first partial good block (PGB) in a set of memory components, the first PGB having first subset of word line groups (WGRs) that are categorized as being non-defective;
computing a quantity of non-defective WGRs in an individual block of the set of memory components;
determining that a percentage of non-defective WGRs of the individual block exceeds a threshold percentage of WGRs;
adding the individual block to a list of PGBs, the individual block comprising the first PGB;
searching for a second PGB in the set of memory components having a second subset of WGRs that are categorized as being non-defective to meet the threshold quantity;
computing a total quantity of WGRs based on a first quantity of WGRs in the first subset of WGRs and a second quantity of WGRs in the second subset of WGRs; and
in response to determining that the total quantity of WGRs is greater than or equal to a threshold quantity of WGRs, combining the first PGB and the second PGB to form an individual virtual block.

18. The method of claim 17, comprising:
accessing configuration data, wherein the configuration data comprises a table that associates different WGRs of blocks of the set of memory components with respective categories being indicative of a type of defect in the different WGRs.

19. A non-transitory computer-readable storage medium comprising instructions that, when executed by a processing device, cause the processing device to perform operations comprising:
identifying a first partial good block (PGB) in a set of memory components, the first PGB having first subset of word line groups (WGRs) that are categorized as being non-defective;
computing a quantity of non-defective WGRs in an individual block of the set of memory components;
determining that a percentage of non-defective WGRs of the individual block exceeds a threshold percentage of WGRs;
adding the individual block to a list of PGBs, the individual block comprising the first PGB;
searching for a second PGB in the set of memory components having a second subset of WGRs that are categorized as being non-defective to meet the threshold quantity;
computing a total quantity of WGRs based on a first quantity of WGRs in the first subset of WGRs and a second quantity of WGRs in the second subset of WGRs; and
in response to determining that the total quantity of WGRs is greater than or equal to a threshold quantity of WGRs, combining the first PGB and the second PGB to form an individual virtual block.

* * * * *